(12) United States Patent
Varghese et al.

(10) Patent No.: US 11,916,167 B2
(45) Date of Patent: Feb. 27, 2024

(54) OPTOELECTRONIC SEMICONDUCTOR CHIP AND METHOD FOR PRODUCING AN OPTOELECTRONIC SEMICONDUCTOR CHIP

(71) Applicant: OSRAM Opto Semiconductors GmbH, Regensburg (DE)

(72) Inventors: Tansen Varghese, Regensburg (DE); Wolfgang Schmid, Kelheim (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 438 days.

(21) Appl. No.: 17/311,643

(22) PCT Filed: Dec. 5, 2019

(86) PCT No.: PCT/EP2019/083855
§ 371 (c)(1),
(2) Date: Jun. 7, 2021

(87) PCT Pub. No.: WO2020/115226
PCT Pub. Date: Jun. 11, 2020

(65) Prior Publication Data
US 2022/0029056 A1    Jan. 27, 2022

(30) Foreign Application Priority Data
Dec. 7, 2018   (DE) .......................... 102018131411.6

(51) Int. Cl.
*H01L 33/22*   (2010.01)
*H01L 33/00*   (2010.01)
(Continued)

(52) U.S. Cl.
CPC ............ *H01L 33/22* (2013.01); *H01L 33/007* (2013.01); *H01L 33/44* (2013.01); *H01L 33/32* (2013.01);
(Continued)

(58) Field of Classification Search
CPC ....... H01L 33/22; H01L 33/007; H01L 33/44; H01L 33/32; H01L 33/382; H01L 33/405
See application file for complete search history.

(56) References Cited

U.S. PATENT DOCUMENTS

| | | | |
|---|---|---|---|
| 2009/0038679 A1* | 2/2009 | Varghese | H01L 31/1804 257/E31.093 |
| 2010/0117070 A1 | 5/2010 | Adekore et al. | |
| 2015/0144984 A1* | 5/2015 | Chen | H01L 33/382 257/99 |

FOREIGN PATENT DOCUMENTS

| | | |
|---|---|---|
| DE | 102005013894 A1 | 1/2006 |
| DE | 102008024517 A1 | 7/2009 |
| DE | 102008012407 A1 | 8/2009 |

OTHER PUBLICATIONS

International Search Report (with English translation) and Written Opinion dated Feb. 13, 2020 for corresponding International Application No. PCT/EP2019/083855 (Examiner, Unknown), 13 pages.

\* cited by examiner

*Primary Examiner* — Marc Anthony Armand
(74) *Attorney, Agent, or Firm* — MH2 TECHNOLOGY LAW GROUP LLP

(57) ABSTRACT

In at least one embodiment, the optoelectronic semiconductor chip comprises a semiconductor layer sequence with a radiation side, a first semiconductor layer of a first conductivity type, an active layer, a second semiconductor layer of a second conductivity type, and a rear side, which are arranged one above the other in this order. The active layer
(Continued)

generates or absorbs primary electromagnetic radiation in the intended operation. Further, the optoelectronic semiconductor chip comprises a first contact structure and a second contact structure for electrically contacting the semiconductor layer sequence. The second contact structure is arranged on the rear side and is in electrical contact with the second semiconductor layer. The radiation side is configured for coupling in or coupling out primary radiation into or out of the semiconductor layer sequence. The rear side is structured and includes scattering structures configured to scatter and redirect the primary radiation.

14 Claims, 3 Drawing Sheets

(51) Int. Cl.
    *H01L 33/44*           (2010.01)
    *H01L 33/32*           (2010.01)
    *H01L 33/38*           (2010.01)
    *H01L 33/40*           (2010.01)

(52) U.S. Cl.
    CPC .......... *H01L 33/382* (2013.01); *H01L 33/405* (2013.01); *H01L 2933/0016* (2013.01); *H01L 2933/0025* (2013.01); *H01L 2933/0091* (2013.01)

OPTOELECTRONIC SEMICONDUCTOR CHIP AND METHOD FOR PRODUCING AN OPTOELECTRONIC SEMICONDUCTOR CHIP

CROSS-REFERENCE TO RELATED APPLICATIONS

This patent application is a national stage entry from International Application No. PCT/EP2019/083855, filed on Dec. 5, 2019, published as International Publication No. WO 2020/115226 A1 on Jun. 11, 2020, and claims priority under 35 U.S.C. § 119 from German patent application 10 2018 131 411.6, filed Dec. 7, 2018, the entire contents of all of which are incorporated by reference herein.

FIELD

An optoelectronic semiconductor chip is specified. Furthermore, a method for producing an optoelectronic semiconductor chip is specified.

BACKGROUND

A task to be solved is to specify an optoelectronic semiconductor chip with a high efficiency for emission or absorption of electromagnetic radiation. Another object to be solved is to specify a method for producing such an optoelectronic semiconductor chip.

These tasks are solved inter alia by the subject matter and the method according to the independent patent claims. Advantageous embodiments and further developments are the subject matter of the dependent patent claims.

SUMMARY

First, an optoelectronic semiconductor chip is specified.

According to at least one embodiment, the optoelectronic semiconductor chip comprises a semiconductor layer sequence with a radiation side, a first semiconductor layer of a first conductivity type, an active layer, a second semiconductor layer of a second conductivity type and a rear side, which are arranged one above the other in this order. In the intended operation, the active layer generates or absorbs primary electromagnetic radiation.

The semiconductor layer sequence is based, for example, on a III-V compound semiconductor material. The semiconductor material is, for example, a nitride compound semiconductor material, such as $Al_n In_{1-n-m} Ga_m N$, or a phosphide compound semiconductor material, such as $Al_n In_{1-n-m} Ga_m P$, or an arsenide compound semiconductor material, such as $Al_n In_{1-n-m} Ga_m As$ or $Al_n In_{1-n-m} Ga_m AsP$, wherein $0 \leq n \leq 1$, $0 \leq m \leq 1$, and $m+n \leq 1$, respectively. Here, the semiconductor layer sequence may comprise dopants as well as additional components. For simplicity, however, only the essential constituents of the crystal lattice of the semiconductor layer sequence, i.e. Al, As, Ga, In, N or P, are specified, even if these may be partially replaced and/or supplemented by small amounts of additional substances. The semiconductor layer sequence may also be based on ZnSSe or GaSb.

The active layer of the semiconductor layer sequence includes in particular at least one pn junction and/or at least one quantum well structure in the form of a single quantum well, SQW for short, or in the form of a multi-quantum well structure, MQW for short. Preferably, the semiconductor chip comprises exactly one contiguous, in particular simply connected, active layer. Alternatively, the active layer may also be segmented.

In the intended operation, the active layer can generate or absorb electromagnetic primary radiation in the blue or green or red spectral range or in the UV range or in the IR range.

A semiconductor chip is understood here and in the following to be a separately manageable and electrically contactable element. A semiconductor chip is created by separation from a wafer composite. Side surfaces of such a semiconductor chip may comprise traces from the separation process. A semiconductor chip preferably comprises exactly one originally contiguous region of the semiconductor layer sequence grown in the wafer compound. The semiconductor layer sequence of the semiconductor chip is preferably formed contiguously. The lateral extent of the semiconductor chip is, for example, at most 1% or at most 5% or at most 10% or at most 20% greater than the lateral extent of the active layer or the semiconductor layer sequence.

Lateral expansion is understood here and in the following in particular as an extension or expansion in any lateral direction. A lateral direction is a direction parallel to the main extension plane of the active layer or the semiconductor layer sequence.

The radiation side and the rear side are opposite cover surfaces of the semiconductor layer sequence. Preferably, the radiation side and the rear side are formed of the semiconductor material of the semiconductor layer sequence. Preferably, the radiation side and the rear side are substantially parallel to each other and parallel to a main extension plane of the semiconductor layer sequence.

The first conductivity type may be n-type or p-type. The second conductivity type is preferably complementary to the first conductivity type, i.e., is p-type or n-type. The first and/or the second semiconductor layer may comprise a plurality of individual layers grown on top of each other.

According to at least one embodiment, the semiconductor chip comprises a first contact structure and a second contact structure for electrically contacting the semiconductor layer sequence. The first and/or second contact structure are electrically conductive. The first and/or second contact structure may comprise or consist of metal and/or a transparent conductive oxide. The first and/or second contact structures may be multilayer or single-piece structures.

In particular, the contact structures serve to inject charge carriers into the semiconductor layer sequence. For example, the first and/or the second contact structure are in direct contact with the semiconductor layer sequence in places for this purpose.

According to at least one embodiment, the second contact structure is arranged on the rear side and in electrical contact with the second semiconductor layer. For example, the second contact structure extends at least in sections parallel or substantially parallel to the main extension plane of the rear side. When viewed from above the rear side, the second contact structure may cover a portion of the rear side, for example at least 50% or at least 75% of the rear side.

The second contact structure is preferably in direct electrical contact with the second semiconductor layer. For example, the second contact structure is directly adjacent to the second semiconductor layer. Via the second contact structure, second charge carriers, such as holes or electrons, are injected into the second semiconductor layer during intended operation.

According to at least one embodiment, the first contact structure is in electrical contact with the first semiconductor layer, preferably in direct electrical contact with the first semiconductor layer. For example, the first contact structure is directly adjacent to the first semiconductor layer. Via the first contact structure, first charge carriers, such as electrons or holes, are injected into the first semiconductor layer during intended operation.

According to at least one embodiment, the radiation side is configured for coupling in or coupling out the primary radiation into or out of the semiconductor layer sequence. For example, in the intended operation of the semiconductor chip, at least 50% or at least 75% or at least 90% of the primary radiation generated by the active layer or absorbed by the active layer is coupled out of the semiconductor layer sequence or coupled into the semiconductor layer sequence via the radiation side. The radiation side may face a carrier, for example a growth substrate for the semiconductor layer sequence. The primary radiation then passes, for example, through the radiation side from the semiconductor layer sequence and penetrates into the carrier. After traversing the carrier, the primary radiation can then be coupled out of the semiconductor chip.

According to at least one embodiment, the rear side is structured and includes scattering structures. The scattering structures are configured to scatter and redirect the primary radiation. For example, a height of the scattering structures, measured perpendicular to the main extension plane of the active layer, and/or a width of the scattering structures, measured in a direction parallel to the main extension plane of the active layer, is on average at least $\lambda/4$ or at least $\lambda/2$, wherein $\lambda$ is the wavelength at which the primary radiation comprises a global intensity maximum. Alternatively or additionally, the average height and/or width may be at most $5\lambda$ or at most $3\lambda$. For example, a mean distance between every two scattering structures is at most $5\lambda$ or at most $3\lambda$. For example, at least 50% or at least 75% of the area of the rear side is provided with scattering structures.

For example, the rear side comprises a mean roughness of at least 300 nm or at least 500 nm or at least 1 µm. Alternatively or additionally, the average roughness may be at most 3 µm or at most 2 µm. To determine the average roughness, it is preferred to average over the entire rear side.

The scattering structures are, for example, formed from a structuring of the rear side of the semiconductor layer sequence. In this respect, the scattering structures are preferably formed from the material of the semiconductor layer sequence. The scattering structures are, for example, elevations of the rear side and/or depressions in the rear side. The elevations and/or depressions may be pyramid-shaped or cone-shaped or truncated pyramid-shaped or truncated cone-shaped. The scattering structures may be evenly or unevenly distributed along the rear side. Different scattering structures may comprise different geometric shapes and/or different heights and/or different widths.

In the region of the scattering structures, the rear side is preferably adjacent to electrically insulating material. That is, in the region of the scattering structures, the rear side is preferably electrically connected neither to the first contact structure nor to the second contact structure.

In at least one embodiment, the optoelectronic semiconductor chip comprises a semiconductor layer sequence with a radiation side, a first semiconductor layer of a first conductivity type, an active layer, a second semiconductor layer of a second conductivity type and a rear side, which are arranged one above the other in this order. The active layer generates or absorbs primary electromagnetic radiation in the intended operation. Further, the optoelectronic semiconductor chip comprises a first contact structure and a second contact structure for electrically contacting the semiconductor layer sequence. The second contact structure is arranged on the rear side and is in electrical contact with the second semiconductor layer. The radiation side is configured for coupling in or coupling out primary radiation into or out of the semiconductor layer sequence. The rear side is structured and includes scattering structures configured to scatter and redirect the primary radiation.

The present invention is based in particular on the realization that a structured semiconductor layer sequence improves the efficiency of the semiconductor chip, in particular of a radiation-emitting semiconductor chip.

Redistribution of the primary radiation occurs at the scattering structures. The redistribution has the advantage of reducing the probability of primary radiation being trapped within the semiconductor layer sequence due to total internal reflection. Normally, the semiconductor layer sequence is structured on the radiation side, i.e., the side through which most of the primary radiation exits or enters during operation.

The inventors have now come to the realization that structuring the radiation side can also be disadvantageous. In particular, if current expansion layers are used in the region of the radiation side, these can be negatively affected by the structuring. Consequently, higher operating voltages become necessary, for example, which can reduce the efficiency of the semiconductor chip.

Now, one idea of the present invention is to relocate the structuring of the semiconductor layer sequence to a rear side of the semiconductor layer sequence that is not intended for coupling in or coupling out the primary radiation. Accordingly, the radiation side and the functional layers in the radiation side region can be optimized without negatively affecting their properties due to structuring.

According to at least one embodiment, the semiconductor chip comprises a mirror on the rear side. In this case, the mirror is specular for the primary radiation generated or absorbed in the active layer. For example, the mirror covers at least 50% or at least 75% or at least 90% of the rear side of the semiconductor layer sequence. For example, the mirror comprises a reflectivity of at least 80% or at least 90% or at least 95% or at least 99% for the primary radiation. The reflectivity is preferably specified at the wavelength $\lambda$ at which the primary radiation comprises a global intensity maximum.

The mirror may comprise a metallic layer. The metallic layer is then preferably reflective for the primary radiation. For example, the metallic layer comprises silver or aluminum. An average distance of the metallic layer to the structured rear side is, for example, at most 5 µm or at most 3 µm or at most 1 µm.

The metallic layer of the mirror may be formed by the first contact structure and/or the second contact structure. Alternatively, the metallic layer may be different from the first contact structure and the second contact structure. For example, the metallic layer of the mirror is then electrically isolated from the semiconductor layer sequence.

According to at least one embodiment, the radiation side is smooth within the manufacturing tolerance. In particular, the radiation side is not structured, that is, it is not selectively provided with structures. For example, an average roughness of the radiation side is at most 100 nm or at most 50 nm or at most 10 nm. In that the radiation side is smooth, the layers or materials adjacent to the radiation side can be optimized with respect to their properties, such as electrical conductivity.

According to at least one embodiment, the first contact structure extends from the rear side through the second semiconductor layer and the active layer into the first semiconductor layer. The first contact structure may completely penetrate the first semiconductor layer or end in the first semiconductor layer. The first contact structure may completely penetrate the semiconductor layer sequence from the rear side to the radiation side. For this purpose, the semiconductor layer sequence comprises one or more recesses filled with the first contact structure. In other words, the first contact structure forms one or more vias in the semiconductor layer sequence.

Sections of the first contact structure may extend parallel or substantially parallel to the main extension plane of the rear side. For example, when viewed from above the rear side, the first contact structure covers at least 50% or at least 75% of the rear side.

Instead of extending into the semiconductor layer sequence from the rear side, the first contact structure may also be arranged on the radiation side of the semiconductor layer sequence. A part of the radiation side, for example at most 25% or at most 10%, may then be covered by the first contact structure.

According to at least one embodiment, the optoelectronic semiconductor chip comprises a current expansion layer on a side of the active layer facing away from the second semiconductor layer. The current expansion layer is configured to laterally spread first charge carriers. In particular, the current expansion layer comprises a higher lateral conductivity for the first charge carriers than layers or elements of the semiconductor chip adjacent to the current expansion layer. First charge carriers are the charge carriers supplied to the semiconductor layer sequence via the first contact structure during operation.

The current expansion layer may be part of the semiconductor layer sequence, in particular part of the first semiconductor layer. Then the current expansion layer is itself a semiconductor layer. Preferably, the current expansion layer then comprises a higher doping concentration than the semiconductor layers adjacent to it. For example, the dopant concentration of the current expansion layer is then at least $1 \cdot 10^{18}$ cm$^{-3}$ or at least $5 \cdot 10^{18}$ cm$^{-3}$ or at least $1 \cdot 10^{19}$ cm$^{-3}$.

Alternatively, it is also possible that the current expansion layer is arranged outside the semiconductor layer sequence on the radiation side. The current expansion layer is then preferably based on a material different from the material of the semiconductor layer sequence. For example, the current expansion layer is then based on a transparent conductive material, such as a transparent conductive oxide, in short TCO, in particular indium tin oxide, in short ITO.

In particular, the conductivity of the current expansion layer may benefit from the fact that the structuring of the semiconductor layer sequence is formed on the rear side, because in this way the current expansion layer may be planar or substantially planar, which facilitates the lateral distribution of the first charge carriers.

According to at least one embodiment, a planarization layer is arranged between the rear side and the mirror, which is smooth on a side facing the mirror within the manufacturing tolerance. For example, an average roughness of the side of the planarization layer facing the mirror is at most 100 nm or at most 50 nm or at most 10 nm. Preferably, the planarization layer comprises or consists of a dielectric material, such as $SiO_2$, $SiN$, $Nb_2O_5$, $TiO_2$, $MgF_2$, $Ta_2O_5$.

Particularly preferably, the planarization layer is transparent to the primary radiation.

The planarization layer fills the spaces between the scattering structures and forms a smooth, preferably also flat surface facing away from the rear side. The mirror can be more easily applied to such a smooth surface and can be designed more efficiently. In particular, the planarization layer reduces the surface area of the metallic layer of the mirror, which reduces the probability for surface absorption of the primary radiation by the metallic layer. At the same time, the planarization layer has little effect on the reflectivity of the mirror.

The planarization layer may be in direct contact with the rear side, in particular the scattering structures. Preferably, the planarization layer comprises a different, in particular smaller, refractive index for the primary radiation than the semiconductor layer sequence. This increases the scattering probability of the primary radiation at the scattering structures. For example, the planarization layer comprises a refractive index smaller by at least 0.5 or at least 1.0 than the semiconductor layer sequence.

According to at least one embodiment, the semiconductor chip comprises a carrier on the radiation side, wherein the carrier supports and mechanically stabilizes the semiconductor layer sequence. In particular, the carrier is transparent or clear to the primary radiation. The semiconductor chip is then, for example, a volume emitter.

The carrier on the radiation side can be the growth substrate of the semiconductor layer sequence. In this case, the semiconductor layer sequence is preferably directly adjacent to the carrier. Alternatively, the carrier on the radiation side can also be applied after the semiconductor layer sequence has grown. Then, for example, a connection layer, for example an adhesive layer, such as a silicone-based adhesive layer, is arranged between the carrier and the radiation side. The connection layer is preferably also transparent or clear to the primary radiation.

For example, the carrier on the radiation side is based on glass or glass ceramic or ceramic or a semiconductor material, such as GaP or SiC, or sapphire or plastic. For example, the carrier comprises a thickness, measured perpendicular to the main extension plane of the active layer, of at least 50 μm or at least 100 μm. When viewed from above the radiation side, the carrier preferably covers a major portion, for example at least 75% or at least 90% or 100%, of the radiation side.

According to at least one embodiment, the semiconductor chip comprises a carrier on the rear side. The carrier mechanically supports and stabilizes the semiconductor layer sequence. The carrier on the rear side may be a metal carrier or semiconductor carrier or ceramic carrier. For example, the carrier is based on silicon. For example, the carrier on the rear side comprises a thickness, measured perpendicular to the main extension direction of the active layer, of at least 50 μm or at least 100 μm. The carrier on the rear side may be electrically conductive. The carrier on the rear side may be nontransmissive to the primary radiation.

If a carrier is arranged on the rear side, preferably no self-supporting carrier is arranged on the radiation side. In particular, the semiconductor chip is then preferably free of a growth substrate for the semiconductor layer sequence. If, on the other hand, a carrier is arranged on the radiation side, preferably no self-supporting carrier is arranged on the rear side. For example, the carrier is the only self-supporting component of the semiconductor chip.

According to at least one embodiment, the second contact structure is arranged at least in sections between the carrier on the rear side and the semiconductor layer sequence. Also, the first contact structure may be arranged at least in sections between the carrier on the rear side and the semiconductor layer sequence.

According to at least one embodiment, the mirror is arranged between the semiconductor layer sequence and the carrier arranged on the rear side.

According to at least one embodiment, the semiconductor chip is a flip chip or a thin film chip.

In the case of a flip chip, contact elements for external electrical contacting of the semiconductor chip are preferably all arranged on the rear side of the semiconductor layer sequence and are exposed on a side facing away from the semiconductor layer sequence in the unmounted state of the semiconductor chip.

In the case of a thin-film chip, the growth substrate of the semiconductor layer sequence is preferably detached. The carrier which mechanically stabilizes the semiconductor layer sequence is then preferably formed on the rear side. The contact elements for making electrical contact with the semiconductor chip can be arranged on the side of the carrier facing the semiconductor layer sequence and, in the unmounted state, can each be exposed on a side facing away from the carrier. Alternatively, one contact element can be arranged on the side of the carrier facing away from the semiconductor layer sequence and, in the unassembled state of the semiconductor chip, be exposed on a side facing away from the carrier. Another contact element is then preferably arranged on the side of the carrier facing the semiconductor layer sequence and, in the unmounted state, is freely accessible on a side facing away from the carrier.

According to at least one embodiment, the mirror comprises a metallic layer and one or more dielectric layers arranged between the metallic layer and the rear side. A combination of one or more dielectric layers with a metallic layer can lead to a particularly high reflectivity for the primary radiation. For example, the dielectric layers each comprise thicknesses between and including 0.2.2 and 0.5.2 Each of the dielectric layers may comprise or consist of, for example, one of the following materials: $SiO_2$, $SiN$, $Nb_2O_5$, $TiO_2$, $MgF_2$, $Ta_2O_5$, $Al_2O_3$, $HfO_2$.

Next, a method for producing an optoelectronic semiconductor chip is specified. The method is particularly suitable for producing an optoelectronic semiconductor chip as just described. That is, all features disclosed in connection with the semiconductor chip are also disclosed for the method, and vice versa.

According to at least one embodiment, the method for producing an optoelectronic semiconductor chip comprises a step A) in which a semiconductor layer sequence is provided on a substrate. Starting from the substrate, the semiconductor layer sequence comprises a first semiconductor layer of a first conductivity type, an active layer and a second semiconductor layer of a second conductivity type in that order. The active layer generates or absorbs primary electromagnetic radiation during intended operation.

The substrate may be the growth substrate for the semiconductor layer sequence. Alternatively, the substrate is a substrate different from the growth substrate, on which the semiconductor layer sequence is arranged, for example glued, after growth. The growth substrate may already be detached in step A). For example, the substrate is a glass substrate or glass ceramic substrate or sapphire substrate or plastic substrate or a semiconductor substrate, for example made of GaP or SiC, or a ceramic substrate. The substrate is preferably transparent.

According to at least one embodiment, the method comprises a step B) in which a rear side of the semiconductor layer sequence facing away from the substrate is structured, wherein scattering structures are formed which are configured for scattering and redirecting the primary radiation. The structuring of the rear side can be produced, for example, by applying an etchant to the rear side. The etchant may be a wet chemical or dry chemical etchant. A mask may be used in the structuring process.

According to at least one embodiment, the method comprises a step C) in which a first contact structure and a second contact structure are formed. The second contact structure is thereby arranged on the rear side and brought into electrical contact with the second semiconductor layer. The first contact structure is brought into electrical contact with the first semiconductor layer.

Preferably, steps A) to C) are carried out in the specified order and one after the other.

According to at least one embodiment, after step B), a mirror is formed on the rear side which is specular for the primary radiation generated or absorbed in the active layer.

According to at least one embodiment, one or more dielectric layers and then a metallic layer are deposited to apply the mirror.

According to at least one embodiment, the first contact structure is formed to extend from the rear side through the second semiconductor layer and the active layer into the first semiconductor layer. For example, one or more recesses are first introduced, for example etched, into the semiconductor layer sequence starting from the rear side. The recesses then extend from the rear side through the second semiconductor layer and the active layer into the first semiconductor layer. The recesses may extend completely through the first semiconductor layer or end in the first semiconductor layer. The one or more recesses may subsequently be filled with the first contact structure, wherein the first semiconductor layer is electrically connected to the first contact structure.

According to at least one embodiment, a planarization layer is arranged on the structured rear side after step B) and before the mirror is applied. Preferably, the planarization layer is initially applied so thick that it is thicker than the maximum height of the scattering structures. In particular, the planarization layer then covers all the scattering structures of the rear side.

Subsequently, the planarization layer is preferably polished until the side of the planarization layer facing away from the semiconductor layer sequence is smooth and/or flat within the manufacturing tolerance.

According to at least one embodiment, after step C), a carrier is formed on the rear side and then the substrate is detached from the semiconductor layer sequence.

Alternatively, the substrate may form the carrier of the semiconductor chip.

BRIEF DESCRIPTION OF THE DRAWINGS

In the following, an optoelectronic semiconductor chip described herein and a method for producing an optoelectronic semiconductor chip described herein are explained in more detail with reference to drawings by means of exemplary embodiments. Identical reference signs thereby specify identical elements in the individual figures. However, no references to scale are shown; rather, individual elements may be shown exaggeratedly large for better understanding.

Showing in.

DETAILED DESCRIPTION

Figure 1:
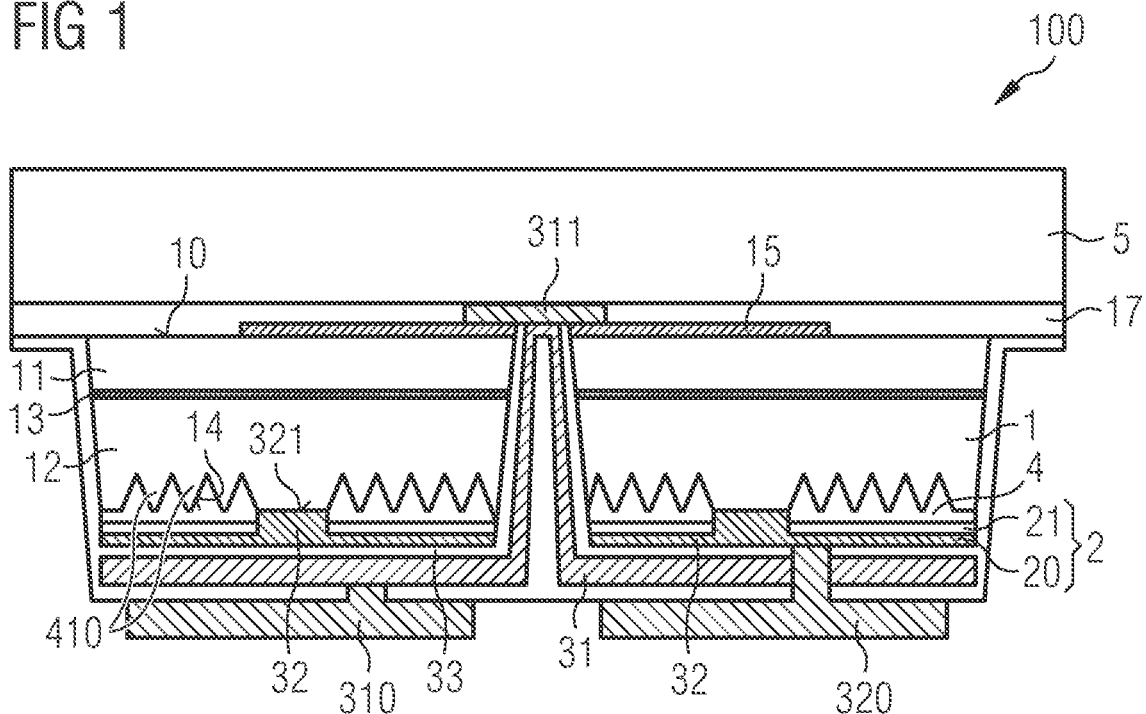
FIGS. 1 and 2 exemplary embodiments of an optoelectronic semiconductor chip in cross-sectional view, FIGS. 3A to 3E different positions in an exemplary method for producing an optoelectronic semiconductor chip.

In FIG. 1, a first exemplary embodiment of an optoelectronic semiconductor chip 100 is shown in cross-sectional view. The semiconductor chip 100 comprises a semiconductor layer sequence 1 with a first semiconductor layer 11, a second semiconductor layer 12, and an active layer 13 between the first semiconductor layer 11 and the second semiconductor layer 12. The active layer 13 is configured to emit primary electromagnetic radiation during intended operation. The semiconductor chip 100 is thus a radiation-emitting semiconductor chip.

The semiconductor layer sequence 1 is based on InGaAlP, for example. The active layer 13 emits, for example, yellow or red light during operation. The first semiconductor layer 11 is p-type conductive, for example, and the second semiconductor layer 12 is n-type conductive, for example. However, reverse doping would also be possible.

The semiconductor layer sequence 1 comprises a radiation side 10 and a rear side 14 opposite the radiation side 10. The radiation side 10 and the rear side 14 form cover surfaces of the semiconductor layer sequence 1 and are formed of the semiconductor material of the semiconductor layer sequence 1. Here, the first semiconductor layer 11 faces the radiation side 10 and the second semiconductor layer 12 faces the rear side 14. Via the radiation side 10, at least 50% or at least 75% of the primary radiation generated in the active layer 13 is coupled out of the semiconductor layer sequence 1 during operation of the semiconductor chip 100.

The rear side 14 of the semiconductor layer sequence is structured and includes a plurality of scattering structures 410. The scattering structures 410 are configured to scatter and redirect the generated primary radiation so that the primary radiation is not trapped within the semiconductor layer sequence 1 due to total internal reflection. For example, the scattering structures 410 comprise average heights and/or widths of at least $\lambda/4$, wherein $\lambda$, is the wavelength of the primary radiation at which the primary radiation comprises a maximum intensity.

The semiconductor chip 100 further comprises a first contact structure 31 and a second contact structure 32 configured to electrically contact the semiconductor layer sequence 1. The contact structures 31, 32 are preferably each formed of or comprise metal.

The first contact structure 31 is in electrical contact with the first semiconductor layer 11. The first contact structure 31 extends in sections along the rear side 14 and covers a part of the rear side 14 when viewed from above the rear side 14. Furthermore, the first contact structure 31 extends within a recess from the rear side 14 through the second semiconductor layer 12, the active layer 13 and the first semiconductor layer 11, thus completely penetrating the semiconductor layer sequence 1.

A contact pad 311 is provided on the radiation side and is electrically conductively connected with the first contact structure 31. The contact pad 311 is formed of a metal, for example. The contact pad 311 is further electrically conductively connected to a current expansion layer 15, which is applied to the radiation side 10 and is electrically conductively connected to the first semiconductor layer 11. The current expansion layer 15 covers, for example, a major part of the radiation side 10. Preferably, the current expansion layer 15 is formed of a material transparent to the primary radiation, in particular a TCO, such as ITO.

A first contact element 310 is provided on the rear side 14 for external electrical contacting of the semiconductor chip 100. The first contact element 310 is electrically conductively connected with the first contact structure 31. The first contact element 310 is formed of metal, for example. Furthermore, the first contact element 310 is exposed on a side of the semiconductor chip 100 facing away from the radiation side 10.

In the intended operation, first charge carriers, for example holes, are injected into the semiconductor chip 100 via the first contact element 310. Starting from the first contact element 310, this reaches the first contact structure 31. Via the first contact structure 31, the first charge carriers are then transported through the semiconductor layer sequence 1 in the recess region and fed into the contact pad 311. Starting from the contact pad 311, the first charge carriers are then injected into the current expansion layer 15 and laterally distributed by means of the current expansion layer 15. Subsequently, the first charge carriers pass from the current expansion layer 15 into the first semiconductor layer 11.

The second contact structure 32 is deposited on the rear side 14 of the semiconductor layer sequence 1 and extends along the rear side 14. For example, viewed in plan view, the second contact structure 32 covers at least 50% or at least 75% of the rear side. In contact regions 321, the second contact structure 32 is in direct mechanical and electrical contact with the rear side 14 of the semiconductor layer sequence 1. In the contact regions 321, the rear side 14 is not structured, but is, for example, flat and/or smooth. Outside the contact regions 321, the rear side 14 is structured.

Furthermore, the second contact structure 32 is electrically conductively connected with a second contact element 320. Like the first contact element 310, the second contact element 320 is applied to the rear side 14 and is used for external electrical contacting of the semiconductor chip 100. The second contact element 320 is exposed on a side facing away from the radiation side 10. The semiconductor chip 100 of FIG. 1 is a so-called flip chip.

In the intended operation of the semiconductor chip, second charge carriers, for example electrons, are fed into the semiconductor chip 100 via the second contact element 320. Starting from the second contact element 320, the second charge carriers are injected into the second contact structure 32 and laterally distributed. Thereafter, the second charge carriers in the contact regions 321 pass from the second contact structure 32 into the second semiconductor layer 12.

The first contact structure 31 and the second contact structure 32 are electrically insulated from each other by means of an electrically insulating layer 33. The electrically insulating layer is, for example, a $SiO_2$ or $Al_2O_3$ or SiN layer.

A mirror 2 is further provided on the rear side 14 of the semiconductor layer sequence 1. In the intended operation of the semiconductor chip 100, the mirror 2 serves to reflect the primary radiation exiting via the rear side 14 back into the semiconductor layer sequence 1. In the present case, the mirror 2 comprises a metallic layer 20 and a dielectric layer 21 between the semiconductor layer sequence 1 and the metallic layer 20. The metallic layer 20 is formed, for example, of silver. The dielectric layer is formed of $SiO_2$, for example. In the present case, the metallic layer 20 forms part of the second contact structure 32, i.e. serves to make electrical contact with the second semiconductor layer 12.

A planarization layer 4, for example made of SiN or SiO$_2$, is also arranged between the mirror 2 and the rear side 14. The planarization layer 4 is flat and/or smooth within the manufacturing tolerance on the side facing away from the semiconductor layer sequence 1. Outside the contact regions 321, the planarization layer 4 is in direct contact with the structured rear side 14.

Furthermore, the optoelectronic semiconductor chip 100 of FIG. 1 comprises a carrier 5 on the radiation side 10. The carrier 5 serves to mechanically stabilize the semiconductor layer sequence 1. The carrier 5 is, for example, the only self-supporting component of the semiconductor chip 100. In the present case, the carrier 5 is applied to the radiation side 10 by means of a transparent connection layer 17. The carrier 5 is, for example, a glass carrier or a plastic carrier or a transparent semiconductor carrier made of, for example, GaP or SiC or a carrier made of a transparent ceramic.

Figure 2:
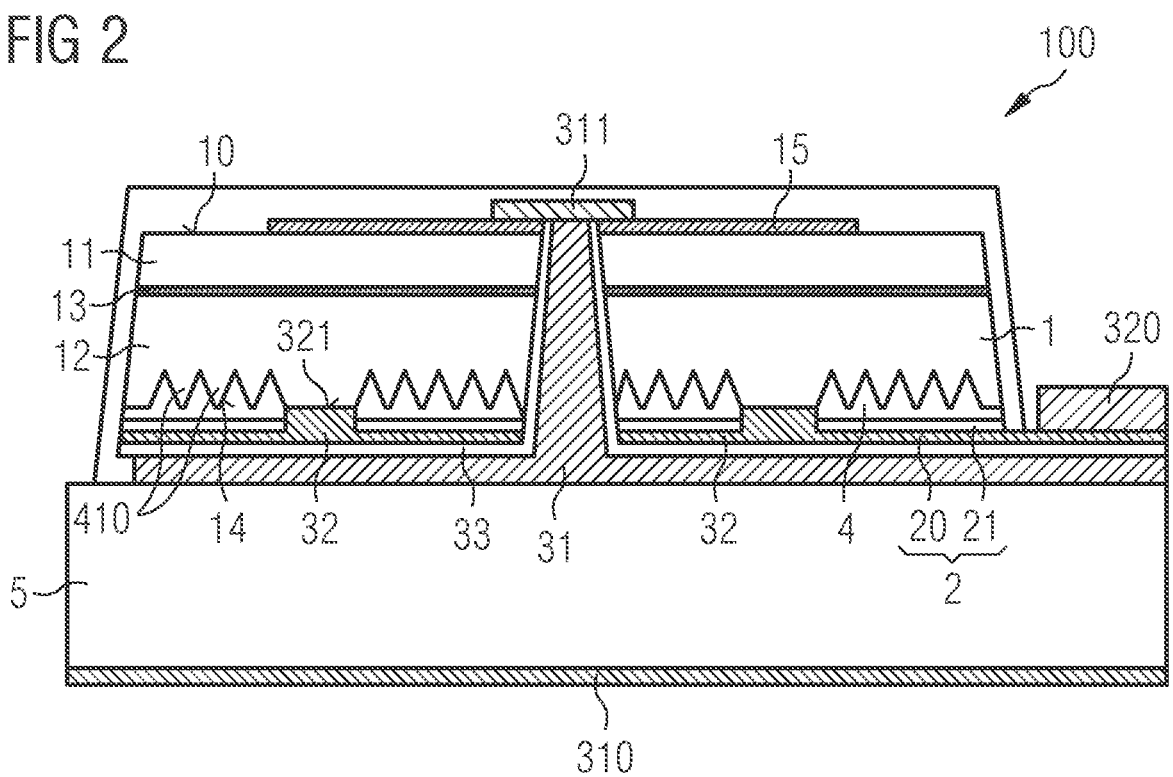

In FIG. 2, a second exemplary embodiment of an optoelectronic semiconductor chip 100 is shown. Instead of being formed on the radiation side 10, the carrier 5 stabilizing the semiconductor chip 100 is now formed on the rear side 14 of the semiconductor layer sequence 1. The carrier 5 on the rear side 14 is, for example, a silicon carrier or metal carrier. A growth substrate of the semiconductor layer sequence 1 is detached. The semiconductor chip of FIG. 2 is a so-called thin-film chip.

The semiconductor chip 100 of FIG. 2 again comprises a first contact element 310, which is applied to the side of the carrier 5 facing away from the semiconductor layer sequence 1. The carrier 5 is electrically conductive. In operation, the first charge carriers 310 then pass from the first contact element 310 through the carrier 5 to the first contact structure 31, which is electrically conductively connected with the carrier 5. In FIG. 2, the second contact element 320 is arranged on a side of the carrier 5 facing the semiconductor layer sequence 1 and is freely accessible on a side facing away from the carrier 5.

Otherwise, the structure of the semiconductor chip 100 of FIG. 2 is substantially the same as the structure of the semiconductor chip 100 of FIG. 1.

Figure 3A:
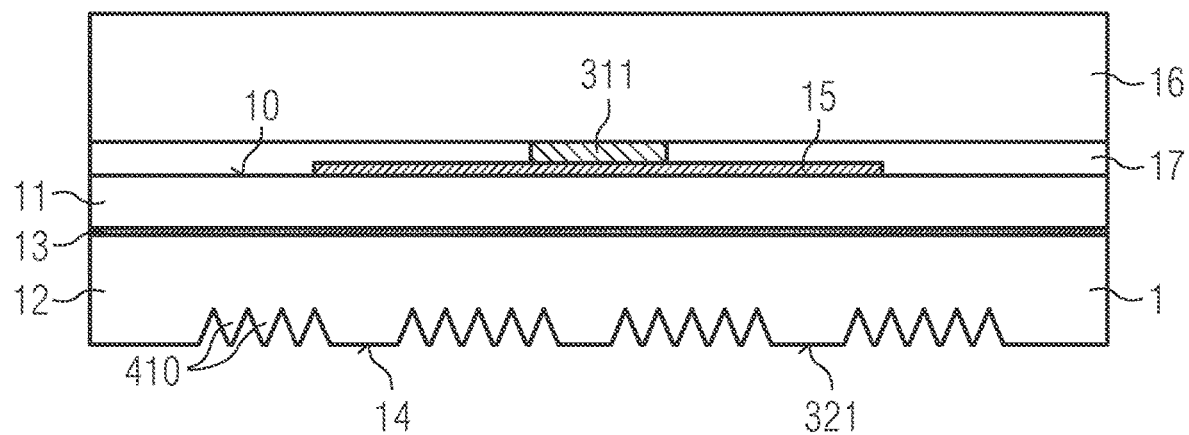

In FIG. 3A, a first position in an exemplary embodiment of the method for producing an optoelectronic semiconductor chip, for example an optoelectronic semiconductor chip according to one of the previously described embodiments, is shown. A semiconductor layer sequence 1 is provided on a substrate 16. In the present embodiment, the semiconductor layer sequence 1 is provided on the substrate 16 via a connection layer 17.

Before the semiconductor layer sequence 1 was deposited on the substrate 16, a metallic contact pad 311 and a current expansion layer 15 were deposited on the semiconductor layer sequence 1. Preferably, the growth substrate of the semiconductor layer sequence 1 was still present when the semiconductor layer sequence 1 was deposited on the substrate 16.

Starting from the substrate 16, the semiconductor layer sequence 1 comprises a first semiconductor layer 11 of a first conductivity type, an active layer 13 for generating or absorbing electromagnetic primary radiation, and a second semiconductor layer 12 of a second conductivity type. Furthermore, a rear side 14 of the semiconductor layer sequence 1 facing away from the substrate 16 is structured with scattering structures 410. The structuring has been achieved, for example, after the growth substrate has been detached by means of an etching process. In contact regions 321 the rear side is free of the structuring.

Alternatively to the case shown in FIG. 3A, it would also be possible that the substrate 16 is a growth substrate on which the semiconductor layer sequence 1 has grown. In that case, no connection layer 17 would be necessary. Also, there would then be no contact pad 311.

Figure 3B:
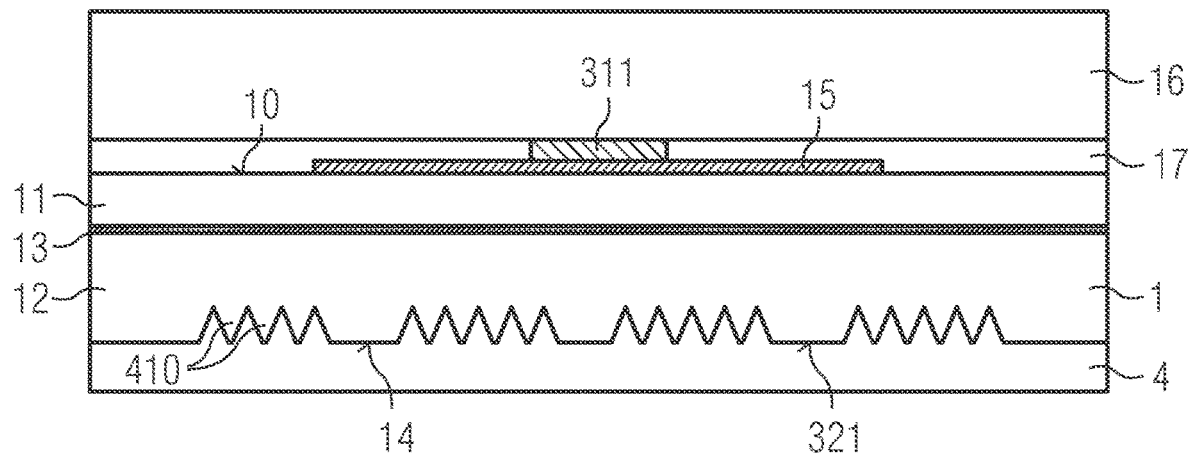

In FIG. 3B, a second position of the method is shown in which a planarization layer 4 is deposited on the rear side 14. In this case, the planarization layer is applied to the rear side 14 in such a thickness that all scattering structures 410 are completely covered by the planarization layer 14.

Figure 3C:
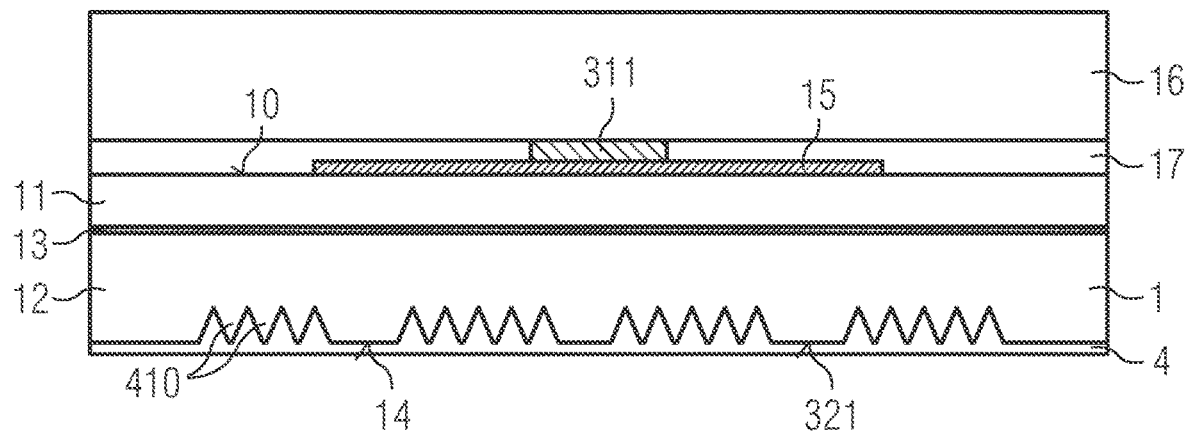

In FIG. 3C, a third position of the method is shown in which the planarization layer 4 is thinned by a polishing step. As a result, the side of the planarization layer 4 facing away from the semiconductor layer sequence 1 is smoothed and/or leveled.

Figure 3D:
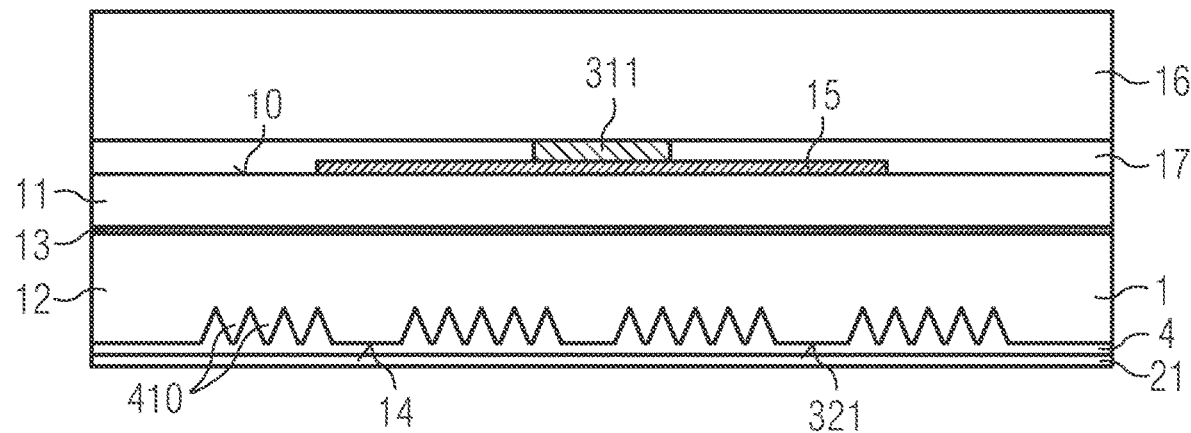

In FIG. 3D, a fourth position of the method is shown in which a dielectric layer 21 is applied to the side of the planarization layer 4 facing away from the semiconductor layer sequence 1.

Figure 3E:
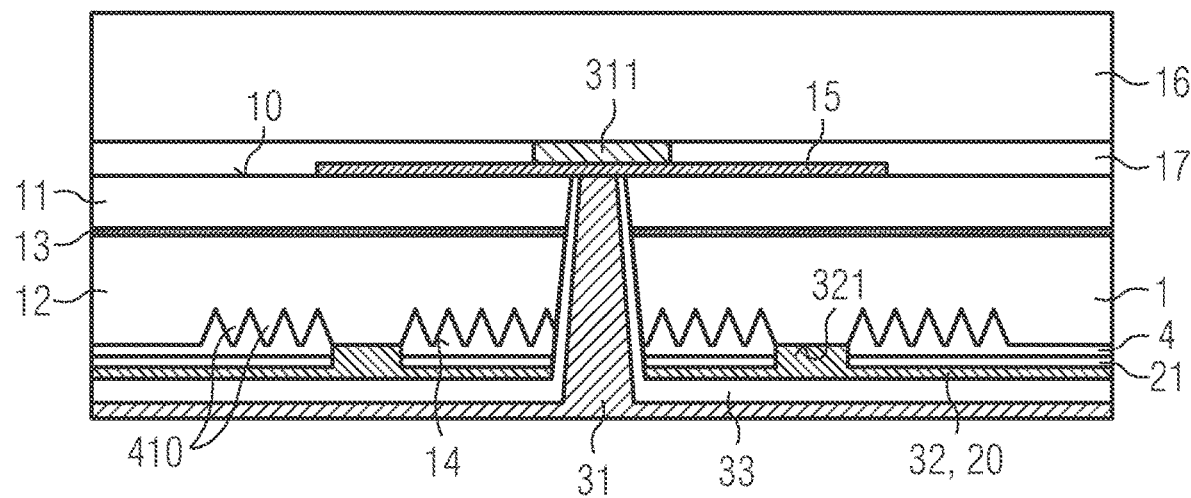

In FIG. 3E, a fifth position of the method is shown in which a metallic layer 20 is additionally deposited on the dielectric layer 21. The dielectric layer 21 and the metallic layer 20 together form a mirror. Furthermore, in the present case, the metallic layer 20 serves as a second contact structure 32 via which the second semiconductor layer 12 is electrically contacted.

An insulation layer 33 is applied to the side of the metallic layer 20 facing away from the semiconductor layer sequence 1, and a first contact structure 31 is applied thereon. The first contact structure 31 extends through a recess in the semiconductor layer sequence 1 and reaches as far as the contact pad 311. The first contact structure 31 thus forms a via through the semiconductor layer sequence 1. According to the position shown in FIG. 3D, the recess for this via is etched into the semiconductor layer sequence 1, for example.

According to the position shown in FIG. 3E, a carrier 5 can be applied to the rear side 14 to produce a semiconductor chip according to FIG. 2. For example, the substrate 16 is then subsequently removed.

Alternatively, however, the substrate 16 may serve as a carrier for the semiconductor layer sequence 1 on the finished semiconductor chip. In this case, preferably no additional carrier is applied to the rear side 14. Thus, for example, a semiconductor chip as shown in FIG. 1 is produced.

The invention is not limited to the exemplary embodiments by the description thereof. Rather, the invention encompasses any new feature as well as any combination of features, which in particular includes any combination of features in the patent claims, even if these features or this combination itself is not explicitly specified in the patent claims or exemplary embodiments.

The invention claimed is:
1. An optoelectronic semiconductor chip comprising
a semiconductor layer sequence with a radiation side, a first semiconductor layer of a first conductivity type, an active layer, a second semiconductor layer of a second conductivity type and a rear side, which are arranged one above the other in this order, wherein the active layer generates or absorbs electromagnetic primary radiation in the intended operation,
a first contact structure and a second contact structure for electrically contacting the semiconductor layer sequence, a mirror on the rear side, wherein the mirror is specular for the primary radiation generated or absorbed in the active layer, wherein the second contact structure is arranged on the rear side (14) and is in electrical contact with the second semiconductor layer, the first contact structure is in electrical contact with the first semiconductor layer and completely penetrates the semiconductor layer sequence from the rear side to the radiation side, the radiation side is configured for coupling in or coupling out the primary radiation into or out of the semiconductor layer sequence, the rear side is structured and comprises scattering structures which are configured to scatter and deflect the primary radiation, between the rear side and the mirror a planarization layer is arranged, which comprises a dielectric material and is smooth within the manufacturing tolerance on a side facing the mirror.

2. The optoelectronic semiconductor chip according to claim 1, wherein the radiation side is smooth within the manufacturing tolerance.

3. The optoelectronic semiconductor chip according to claim 1, wherein the first contact structure extends from the rear side through the second semiconductor layer and the active layer into the first semiconductor layer.

4. The optoelectronic semiconductor chip according to claim 1, further comprising a current expansion layer on a side of the active layer opposite to the second semiconductor layer, wherein the current expansion layer is configured to laterally spread first charge carriers.

5. The optoelectronic semiconductor chip according to claim 1, further comprising a carrier on the radiation side, wherein the carrier supports and mechanically stabilizes the semiconductor layer sequence.

6. The optoelectronic semiconductor chip according to claim 1, further comprising a carrier on the rear side, wherein the carrier supports and mechanically stabilizes the semiconductor layer sequence, the second contact structure is arranged at least in sections between the carrier and the semiconductor layer sequence.

7. The optoelectronic semiconductor chip according to claim 6, wherein the mirror is arranged between the semiconductor layer sequence and the carrier.

8. The optoelectronic semiconductor chip according to claim 1, wherein the semiconductor chip is a flip chip or a thin film chip.

9. The optoelectronic semiconductor chip according to claim 1, wherein the mirror comprises a metallic layer and one or more dielectric layers disposed between the metallic layer and the rear side.

10. A method for producing an optoelectronic semiconductor chip comprising:

A) providing a semiconductor layer sequence on a substrate, wherein the semiconductor layer sequence, starting from the substrate, comprises a first semiconductor layer of a first conductivity type, an active layer, and a second semiconductor layer of a second conductivity type in this order, wherein the active layer generates or absorbs electromagnetic primary radiation during intended operation and wherein the semiconductor layer sequence comprises a radiation side which is configured for coupling in or coupling out the primary radiation into or out of the semiconductor layer sequence and which is smooth within the manufacturing tolerance;

B) structuring a rear side of the semiconductor layer sequence facing away from the substrate, wherein scattering structures are formed which are configured for scattering and redirecting the primary radiation;

C) forming a first contact structure and a second contact structure, wherein—the second contact structure is arranged on the rear side and is brought into electrical contact with the second semiconductor layer, —the first contact structure is brought into electrical contact with the first semiconductor layer, —after the step B), a mirror is formed on the rear side, which is specular for the primary radiation generated or absorbed in the active layer, —after step B) and before the mirror is applied, a planarization layer is arranged on the structured rear side, —the planarization layer comprises a dielectric material, —the planarization layer is initially applied in such a thickness that it is thicker than the maximum height of the scattering structures of the rear side, —the planarization layer is subsequently polished until the side of the planarization layer facing away from the semiconductor layer sequence is smooth within the manufacturing tolerance.

11. The method according to claim 10, wherein one or more dielectric layers and then a metallic layer are first deposited for depositing the mirror.

12. The method according to claim 10, wherein the first contact structure is formed such that it extends from the rear side through the second semiconductor layer and the active layer into the first semiconductor layer.

13. The method according to claim 10, wherein after step C) a carrier is formed on the rear side and subsequently the substrate is detached from the semiconductor layer sequence.

14. An optoelectronic semiconductor chip comprising a semiconductor layer sequence with a radiation side, a first semiconductor layer of a first conductivity type, an active layer, a second semiconductor layer of a second conductivity type and a rear side, which are arranged one above the other in this order, wherein the active layer generates or absorbs electromagnetic primary radiation in the intended operation, a first contact structure and a second contact structure for electrically contacting the semiconductor layer sequence, a mirror on the rear side, wherein the mirror is specular for the primary radiation generated or absorbed in the active layer, wherein the second contact structure is arranged on the rear side and is in electrical contact with the second semiconductor layer, the first contact structure is in electrical contact with the first semiconductor layer, the radiation side is configured for coupling in or coupling out the primary radiation into or out of the semiconductor layer sequence, the rear side is structured and comprises scattering structures which are configured to scatter and deflect the primary radiation, between the rear side and the mirror a planarization layer is arranged, which comprises a dielectric material and is smooth within the manufacturing tolerance on a side facing the mirror, and the radiation side is smooth within the manufacturing tolerance.

\* \* \* \* \*

UNITED STATES PATENT AND TRADEMARK OFFICE
CERTIFICATE OF CORRECTION

| | |
|---|---|
| PATENT NO. | : 11,916,167 B2 |
| APPLICATION NO. | : 17/311643 |
| DATED | : February 27, 2024 |
| INVENTOR(S) | : Tansen Varghese et al. |

It is certified that error appears in the above-identified patent and that said Letters Patent is hereby corrected as shown below:

In the Claims

In Claim 1:
At Column 13, Line 5, delete "(14)".

Signed and Sealed this
Fourteenth Day of May, 2024

*Katherine Kelly Vidal*

Katherine Kelly Vidal
*Director of the United States Patent and Trademark Office*